(12) United States Patent
Tunks et al.

(10) Patent No.: US 12,426,149 B2
(45) Date of Patent: Sep. 23, 2025

(54) HEATER APPARATUS FOR A COMPUTING DEVICE

(71) Applicant: Dell Products L.P., Round Rock, TX (US)

(72) Inventors: Eric Michael Tunks, Austin, TX (US); Richard Mark Eiland, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 925 days.

(21) Appl. No.: 17/576,708

(22) Filed: Jan. 14, 2022

(65) Prior Publication Data
US 2023/0232525 A1    Jul. 20, 2023

(51) Int. Cl.
H05K 1/02    (2006.01)
H05K 3/32    (2006.01)

(52) U.S. Cl.
CPC .......... *H05K 1/0212* (2013.01); *H05K 3/325* (2013.01); *H05K 2201/10409* (2013.01)

(58) Field of Classification Search
CPC ................. H05K 1/0212; H05K 3/325; H05K 2201/10409; H05K 7/20836; G06F 1/183; G06F 1/206; G06F 1/20
See application file for complete search history.

(56) References Cited

U.S. PATENT DOCUMENTS

2016/0218264 A1*  7/2016  Tischler .................. H01L 25/18

* cited by examiner

Primary Examiner — Robert G Bachner
(74) Attorney, Agent, or Firm — Aly Z. Dossa; Chamberlain Hrdlicka

(57) ABSTRACT

A computing device includes a printed circuit board, a base, and a heater apparatus. The printed circuit board is secured to the base. The heater apparatus includes a heater component and a plurality of heater wires, and the heater component is disposed between the printed circuit board and the base.

11 Claims, 5 Drawing Sheets

HEATER APPARATUS FOR A COMPUTING DEVICE

BACKGROUND

Computing devices may perform services. In order to provide the services, the computing devices may include hardware components and software components. The software components may utilize the hardware components to provide the services.

SUMMARY

In general, in one aspect, the invention relates to a computing device. The computing device includes a printed circuit board, a base, and a heater apparatus. The printed circuit board is secured to the base. The heater apparatus includes a heater component and a plurality of heater wires, and the heater component is disposed between the printed circuit board and the base.

In general, in one aspect, the invention relates to an information handling system including a plurality of computing devices. Each computing device includes a printed circuit board, a base, and a heater apparatus. The printed circuit board is secured to the base. The heater apparatus includes a heater component and a plurality of heater wires, and the heater component is disposed between the printed circuit board and the base.

In general, in one aspect, the invention relates to a method for heating a printed circuit board. The method for heating the printed circuit board may include determining an environmental condition of a computing device; in response to determination, initiating heating of at least a portion of the printed circuit board using a heater component, and the heater component is disposed between the printed circuit board and a base, and the printed circuit board is secured to the base.

BRIEF DESCRIPTION OF DRAWINGS

Certain embodiments of the invention will be described with reference to the accompanying drawings. However, the accompanying drawings illustrate only certain aspects or implementations of the invention by way of example, and are not meant to limit the scope of the claims.

DETAILED DESCRIPTION

Figure 1:
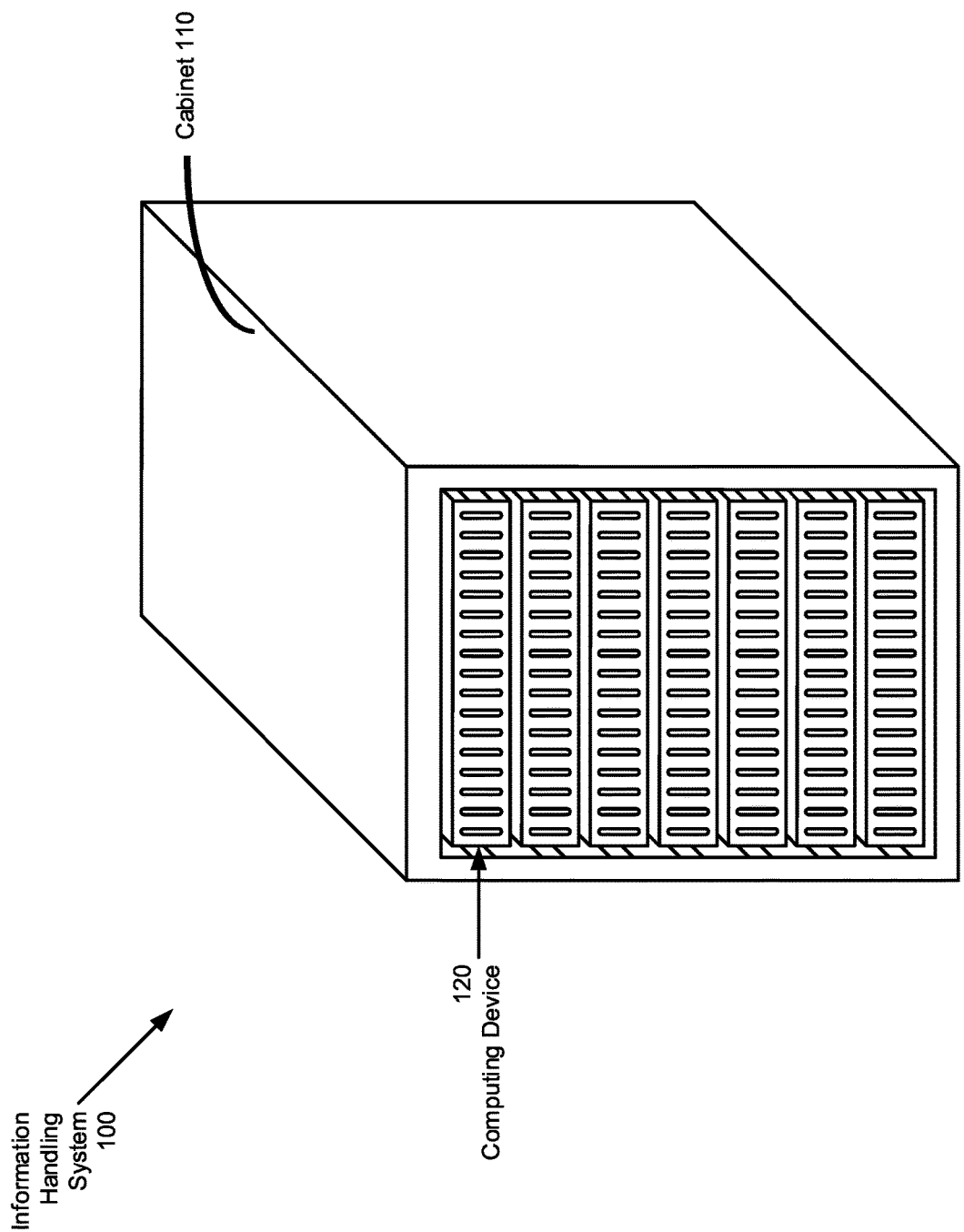
FIG. 1 shows a diagram of an information handling system in accordance with one or more embodiments of the invention.

Specific embodiments will now be described with reference to the accompanying figures. In the following description, numerous details are set forth as examples of the invention. It will be understood by those skilled in the art that one or more embodiments of the present invention may be practiced without these specific details, and that numerous variations or modifications may be possible without departing from the scope of the invention. Certain details known to those of ordinary skill in the art are omitted to avoid obscuring the description.

In the following description of the figures, any component described with regard to a figure, in various embodiments of the invention, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the invention, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection. Thus, any path through which information and/or power may travel may be considered an operative connection.

Computing devices may include any number of hardware components that facilitate providing the services of the computing devices. The hardware components may include, for example, processors, non-persistent storage drives, persistent storage drives, circuit cards that interconnect these components, etc. In some cases, computing devices might be deployed in environments that result in the temperature of the computing devices being outside of their designed operating range. For example, the computing devices may be designed to operate at temperatures above 0° C. When the computing devices are deployed to harsh environmental conditions (e.g., −40° C.-60° C.), the computing devices may not operate properly and, in certain scenarios, may be damaged.

To address one or more of the aforementioned issues, embodiments of the invention provide a heating mechanism to heat the hardware components to a temperature that is within their designed operating range. More specifically, embodiments of the invention include a heater component(s) that is disposed between the base of the computing device and the printed circuit board. The positioning of the heater component enables targeted heating of one or more hardware components on the printed circuit board, while not taking up valuable space within the computing device.

Various embodiments of the computing device are described below.

FIG. 1 shows a diagram of an information handling system (100) in accordance with one or more embodiments of the invention. The system may include a cabinet (110) and any number of computing devices (e.g., 120).

The cabinet (110) may be a mechanical structure that enables computing devices (e.g., 120) to be positioned with respect to one another. For example, the cabinet (110) may be a rack mountable enclosure that enables computing devices (e.g., 120) to be disposed within it. The cabinet (110) may be implemented as other types of structures adapted to house, position, orient, and/or otherwise physically, mechanically, electrically, and/or thermally manage computing devices (e.g., 120). By managing the computing devices (e.g., 120), the cabinet (110) may enable multiple computing devices to be densely packed in a space without negatively impacting the operation of the information handling system (100).

A computing device (e.g., 120) may be a mechanical structure for housing components of the information handling system (100). For example, the computing device (e.g., 120) may be implemented as a rack mountable enclosure for housing components of the information handling system. The computing device (e.g., 120) may be adapted to be disposed within the cabinet (110) and/or utilize services provided by the cabinet (110) and/or other devices.

To provide services, the computing device (e.g., 120) may utilize computing device resources provided by hardware components. The hardware components may include, for example, processors, non-persistent storage drives, a printed circuited board(s), persistent storage drives, special purpose hardware, and/or other types of physical components that contribute to the operation of the computing device.

Figure 2:
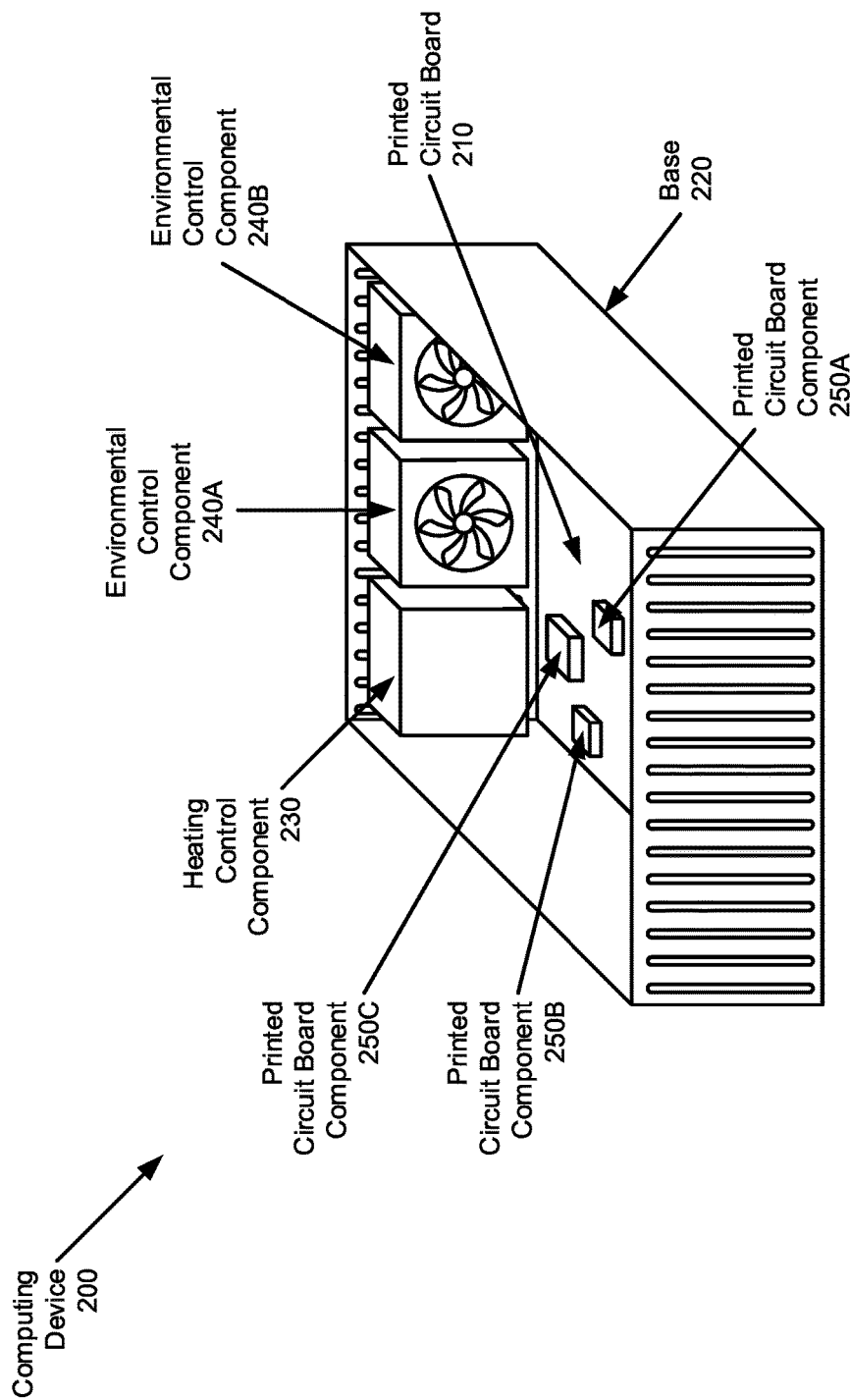
FIG. 2 shows a diagram of a computing device in accordance with one or more embodiments of the invention.

Turning now to FIG. 2, FIG. 2 shows a diagram of a computing device (200) in accordance with one or more embodiments of the invention. In one or more embodiments of the invention, the computing device includes six sides (i.e., top, bottom, right, left, front, and back) and a heater component that is disposed between a printed circuit board and a base (i.e., bottomside of the computing device) to bring the hardware components of the computing device into an appropriate operating temperature range (e.g., above 0° C.) when necessary. A heater component integrated base may improve stability and functionality of the computing device as it provides computer-implemented services in harsh environmental conditions. To provide services, the computing device (200) may utilize computing device resources provided by hardware components housed within the computing device.

The hardware components may include, for example, persistent storage drives (not shown), non-persistent storage drives (not shown), processors (not shown), and/or other types of physical components that contribute to the operation of the computing device (200). In other embodiments, one or more of the hardware components may be omitted or additional hardware components may be added based on the services provided by the computing device. In one or more embodiments of the invention, the computing device (200) includes a printed circuit board (210), a base (220), a heating control component (230), a number of environmental control components (e.g., 240A, 240B, etc.), a number of printed circuit board components (e.g., 250A, 250B, 250C, etc.), and a heater apparatus that includes a heater component (not shown) and a number of heater wires (not shown).

In one or more embodiments of the invention, the printed circuit board components (e.g., 250A, 250B, 250C) may be mounted on the topside of the printed circuit board (210) (as shown), or may be mounted at the bottomside of the printed circuit board (210) (not shown). The heating control component (230) may provide heating control services. The heating control services may include (i) obtaining information regarding the temperature of one or more hardware components within the computing device (200) (also referred to as obtaining the environmental condition of the computing device), where the information may be obtained from one or more temperature sensors in the computing device (not shown), (ii) determining whether the temperature within the computing device is below the appropriate operating temperature range (e.g., whether the temperature is below 0° C.), and (iii) initiating a heating process to bring the hardware components of the computing device into their designed operating temperature.

While illustrated as a physical structure, the heating control component (230) may be implemented as a logical entity (e.g., a program executing using the printed circuit board components (e.g., 250A, 250B, 250C)). For example, the computing device (200) may host a program that provides the functionality of the heating control component (230).

In one or more embodiments of the invention, the environmental control components (e.g., 240A, 240B) may include physical devices that provide functionality to alter characteristics (e.g., airflow directions, humidity and temperature levels, etc.) of the internal environment of the computing device (200) at a macroscopic level. For example, the environmental control components (e.g., 240A, 240B) may include gas movers such as fans. The fans may be able to change a rate of gases being taken into and expelled from the computing device (200).

Those skilled in the art will appreciate that while the heating control component (230) and the environmental control components (e.g., 240A, 240B) are shown that they are located at the backside of the computing device (200), those components may be placed at any location within the computing device without departing from the invention.

Figure 3:
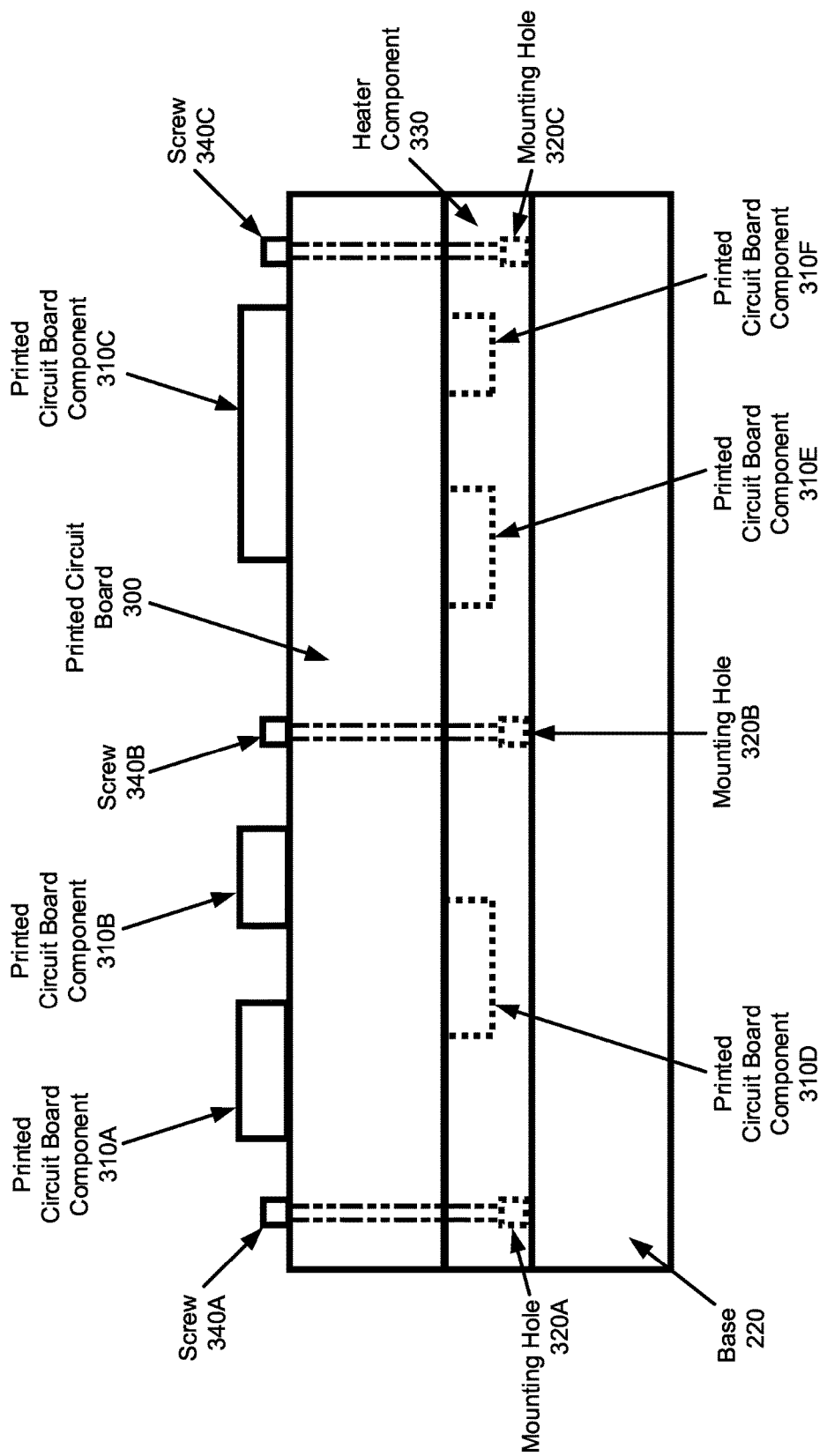
FIG. 3 shows a side-view of a portion of a computing device in accordance with one or more embodiments of the invention.

Turning now to FIG. 3, FIG. 3 shows a side-view of a portion of the computing device in accordance with one or more embodiments of the invention. In one or more embodiments of the invention, the side-view of the portion of the computing device includes a printed circuit board (300), a number of printed circuit board components (e.g., 310A-310F, etc.) either mounted on the topside or at the bottomside of the printed circuit board (300), a number of mounting holes (e.g., 320A, 320B, 320C, etc.), a heater component (330), a number of screws (e.g., 340A, 340B, 340C, etc.) passing through the printed circuit board (300) and the heater component (330). The screws (e.g., 340A, 340B, 340C) interface with the mounting holes (e.g., 320A, 320B, 320C) to secure the printed circuit board (300) to the base (220). While FIG. 3 shows a set of screws, any number of screws, any configuration of screws, and any placement of screws may be used to secure the printed circuit board (300) to the base (220) without departing from the invention.

In one or more embodiments of the invention, the heater component (330) is made of silicon rubber, any other material, and/or any combination thereof that enables the heater component to perform the functions described herein. The heater component has sufficient thickness and compliance such that it sufficiently conforms to the bottomside of the printed circuit board and the bottomside printed circuit board components to form a direct thermal contact. Further, the heater component includes a number of holes (not shown) that are aligned with the mounting holes, which are located on the topside of the base (200) (i.e., mounting surface of the base). The holes allow the screws (e.g., 340A, 340B, 340C) to pass through and interface with the mounting holes on the base.

In one or more embodiments of the invention, the heater component (330) is disposed between the printed circuit board (300) and the base (220) to secure the heater component in place. If there are printed circuit board components (e.g., 310A-310F) mounted at the bottomside of the printed circuit board (300), shown with dash lines, such printed circuit board components will be in direct thermal contact with the heater component.

Continuing with the discussion of FIG. 3, the heater component (330) is also in direct thermal contact with the base (220). In one or more embodiments of the invention, the heater component is operatively connected to the printed circuit board (300), where the printed circuit board provides the required power to the heater component to initiate the heating process.

In another embodiment of the invention, the heater component is operatively connected to the heating control component (e.g., 230, FIG. 2), where the heating control component provides the required power to the heater component to initiate the heating process.

Those skilled in the art will appreciate that the heater component (330) may be supplied with power, directly or indirectly (e.g., via the heating control component, the printed circuit board, etc.), via one or more power supplies (not shown) within the computing device.

Figure 4:
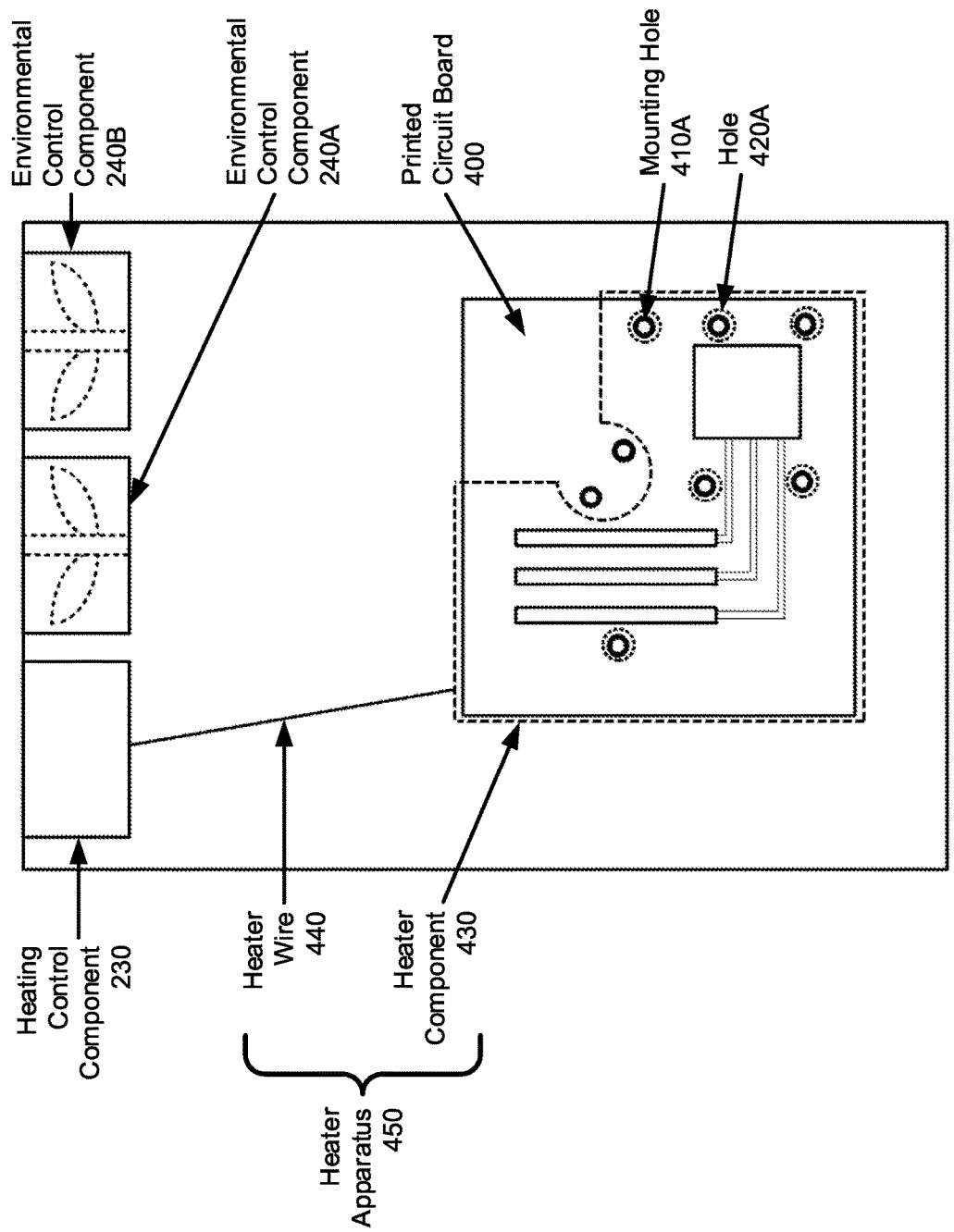
FIG. 4 shows a top-view of a computing device in accordance with one or more embodiments of the invention.
Figure 5:
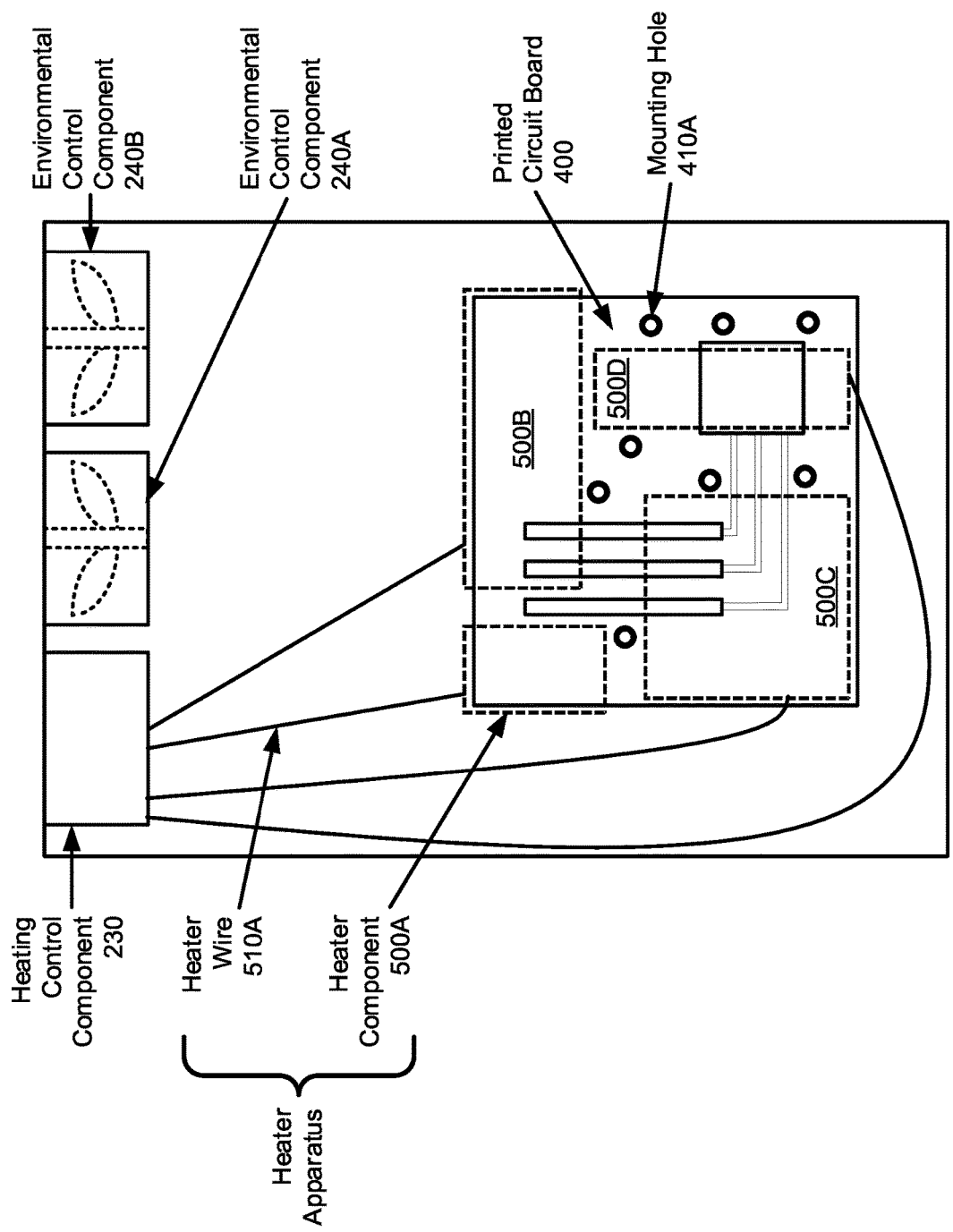
FIG. 5 shows a top-view of a computing device in accordance with one or more embodiments of the invention.

FIGS. 4 and 5 show the compatibility of one or more embodiments of the invention below.

Turning now to FIG. 4, FIG. 4 shows a top-view of a computing device in accordance with one or more embodiments of the invention. In one or more embodiments of the invention, the top-view of the computing device includes a printed circuit board (400), a number of mounting holes (e.g., 410A), a number of holes (e.g., 420A) that allow a number of screws (not shown) to pass through the printed circuit board and a heater component (430, shown with dash lines), a heater apparatus (450) that includes the heater component (430) and a heater wire (440), a heating control component (230), and a number of environmental control components (e.g., 240A, 240B, etc.), as described throughout the application.

In one or more embodiments of the invention, the heater component (430) is disposed between the printed circuit board (400) and the base (not shown). It has a monolithic shape that is aligned with the printed circuit board and the base, and it may take up a large chunk of space in between the printed circuit board and the base. While FIG. 4 shows that the heater component is mostly overlapping with the printed circuit board, there may be embodiments that the heater component may extend the edges of the printed circuit board, where the area of the heater component is still less than the area of the printed circuit board. In one or more embodiments of the invention, the monolithic shape of the heater component (430) provides uniform heating throughout the printed circuit board (210) as a result of the applied power, in which the printed circuit board components (not shown) either mounted on the topside or at the bottomside of the printed circuit board will be heated up to their corresponding operating temperature approximately at the same time, depending on a temperature gradient of the heater component.

Turning now to FIG. 5, FIG. 5 shows a top-view of a computing device in accordance with one or more embodiments of the invention. In one or more embodiments of the invention, the top-view of the computing device includes a printed circuit board (400), a number of mounting holes (e.g., 410A), a number of heater apparatuses that include a number of custom-sized heater components (e.g., 500A, 500B, 500C, 500D) and a number of heater wires (e.g., 510A), a heating control component (230), and a number of environmental control components (e.g., 240A, 240B, etc.), as described throughout the application.

In one or more embodiments of the invention, the custom-sized heater components (e.g., 500A, 500B, 500C, 500D) are disposed between the printed circuit board (400) and the base (not shown). They are aligned with the printed circuit board and the base. While FIG. 5 shows the custom-sized heater components are mostly overlapping with the printed circuit board, there may be embodiments that the custom-sized heater components may extend the edges of the printed circuit board, where the total area of the custom-sized heater components are still less than the area of the printed circuit board.

In one or more embodiments of the invention, the custom-sized heater components (e.g., 500A, 500B, 500C, 500D) may be organized such that they can be excluded from an area of the printed circuit board that does not require heating and they can provide the ability of selective heating of the printed circuit board to maximize heating process efficiency. For example, a particular area of the printed circuit board may require higher temperature increase than other areas of the printed circuit board. To bring this particular area into its operating temperature in a short period of time, more power can be applied to one or more custom-sized heater components that are close to the particular area to make those custom-sized heaters hotter than the remaining custom-sized heaters.

The problems discussed above should be understood as being examples of problems solved by embodiments of the invention disclosed herein and the invention should not be limited to solving the same/similar problems. The disclosed invention is broadly applicable to address a range of problems beyond those discussed herein.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

The invention claimed is:

1. An information handling system, comprising
a plurality of computing devices, each computing device comprising:
a printed circuit board;
a base, wherein the printed circuit board is secured to the base; and
a heater apparatus, wherein the heater apparatus comprises a heater component and a plurality of heater wires, wherein the heater component is disposed between the printed circuit board and the base.

2. The information handling system of claim 1, wherein the heater component has a shape that is aligned with the printed circuit board and the base.

3. The information handling system of claim 1, further comprising:
a second heater component disposed between the printed circuit board and the base.

4. The information handling system of claim 3, wherein the heater component and the second heater component operate independently.

5. The information handling system of claim 1, wherein the heater component is a silicon rubber heater.

6. The information handling system of claim 1, wherein an area of the heater component is less than an area of the printed circuit board.

7. The information handling system of claim 1, wherein the heater apparatus comprises a plurality of holes that are aligned with a plurality of mounting holes on top of the base.

8. The information handling system of claim 7, wherein the plurality of holes allows a plurality of screws to pass through the printed circuit board and the heater component, and interface with the plurality of mounting holes.

9. The information handling system of claim 1, wherein the printed circuit board is in direct thermal contact with the heater component, and the heater component is in direct thermal contact with the base.

10. A method for heating a printed circuit board, comprising:
    determining an environmental condition of a computing device; and
    in response to determination, initiating heating of at least a portion of the printed circuit board using a heater component, wherein the heater component is disposed between the printed circuit board and a base, wherein the printed circuit board is secured to the base.

11. The method of claim 10, further comprising:
    based on the determination:
    initiating heating of at least a portion of the printed circuit board using a second heater component, wherein the second heater component is disposed between the printed circuit board and the base, wherein the printed circuit board is secured to the base.

* * * * *